«12» United States Patent
Xiang et al.

[11] Patent Number: 6,133,129
[45] Date of Patent: Oct. 17, 2000

[54] METHOD FOR FABRICATING A METAL STRUCTURE WITH REDUCED LENGTH THAT IS BEYOND PHOTOLITHOGRAPHY LIMITATIONS

[75] Inventors: Qi Xiang, Santa Clara; Scott A. Bell; Chih-Yuh Yang, both of San Jose, all of Calif.

[73] Assignee: Advanced Micro Devices, Inc., Sunnyvale, Calif.

[21] Appl. No.: 09/306,875

[22] Filed: May 7, 1999

[51] Int. Cl.$^7$ ............................................. H01L 21/3205
[52] U.S. Cl. ................ 438/585; 438/197; 438/DIG. 947
[58] Field of Search .................................... 438/197, 585, 438/DIG. 926, DIG. 947, 587

[56] References Cited

U.S. PATENT DOCUMENTS 5,707,721  1/1998  Jang ........................................ 438/294
6,060,377  5/2000  Xiang et al. ............................ 438/585

*Primary Examiner*—Charles Bowers
*Assistant Examiner*—Evan Pert
*Attorney, Agent, or Firm*—Monica H. Choi

[57] ABSTRACT

A metal structure is fabricated with a reduced length that is beyond that achievable from photolithography by using a silicidation anneal to control the reduced length. Generally, the present invention includes a step of forming a base metal structure on a semiconductor substrate. The base metal structure has a first predetermined length defined by sidewalls on ends of the first predetermined length of the base metal structure. The present invention also includes the step of depositing a layer of silicon on the sidewalls of the base metal structure, and this layer of silicon has a predetermined thickness. The layer of silicon reacts with the base metal structure at the sidewalls of the base metal structure in a silicidation anneal to form metal silicide comprised of the layer of silicon that has reacted with the base metal structure at the sidewalls of the base metal structure. The base metal structure has a second predetermined length that is reduced from the first predetermined length when the layer of silicon has consumed into the sidewalls of the base metal structure after the silicidation anneal. The second predetermined length depends on the predetermined thickness of the layer of silicon deposited on the sidewalls of the base metal structure before the silicidation anneal. After the silicidation anneal, the metal silicide is then removed from the sidewalls of the base metal structure. A remaining portion of the base metal structure, after the metal silicide is removed, forms the metal structure of the present invention having the reduced length that is substantially equal to the second predetermined length. The present invention may be used to particular advantage when the metal structure having the reduced length forms a gate electrode of a MOSFET (Metal Oxide Semiconductor Field Effect Transistor).

9 Claims, 3 Drawing Sheets

METHOD FOR FABRICATING A METAL STRUCTURE WITH REDUCED LENGTH THAT IS BEYOND PHOTOLITHOGRAPHY LIMITATIONS

TECHNICAL FIELD

This invention relates to integrated circuit fabrication, and more particularly, to a method for fabricating a metal structure such as a metal gate of a MOSFET (Metal Oxide Semiconductor Field Effect Transistor), using silicidation anneal to achieve a reduced length that is beyond photolithography limitations.

BACKGROUND OF THE INVENTION

The present invention is described for achieving a reduced length of a metal structure used as a gate electrode of a MOSFET (Metal Oxide Semiconductor Field Effect Transistor). However, the present invention may be used for fabrication of a metal structure having a reduced length that is beyond photolithography limitations for any other type of application aside from just the example of a gate electrode of a MOSFET, as would be apparent to one of ordinary skill in the art from the description herein.

MOSFETs (Metal Oxide Semiconductor Field Effect Transistors) are a common component of integrated circuits. A typical MOSFET includes a drain, a source, a gate dielectric, and a gate electrode as known to one of ordinary skill in the art of integrated circuits. The gate electrode is comprised of a conductive material and is disposed to abut the gate dielectric.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

For improved performance of a MOSFET, dimensions of the MOSFET including the length of the gate electrode are further scaled down. As known to one of ordinary skill in the art, photolithography technology is commonly used for defining the size and shape of the gate electrode of a MOSFET in an integrated circuit. However, a bottleneck for further scaling down of the gate electrode of a MOSFET is the limitation of photolithography technology from optical diffraction, as known to one of ordinary skill in the art of integrated circuit fabrication. In current photolithography technology, using UV (Ultra-Violet) or deep UV (Ultra-Violet) light as the illumination source for example, gate lengths that are smaller than 0.1 µm may not be achieved because of optical diffraction.

A prior art technology for achieving MOSFET gate lengths that are beyond those achievable from photolithography technology is photoresist trimming. In this prior art technology, the photoresist layer used in a typical photolithography process is further etched down to smaller dimensions to achieve smaller device size. However, the size and shape of a structure fabricated using photoresist trimming may be difficult to control, as known to one of ordinary skill in the art of integrated circuit fabrication.

For improved performance of a MOSFET, as the thickness of the gate oxide is further scaled down with the dimensions of the MOSFET, a gate dielectric with a higher breakdown voltage than silicon dioxide is used. In addition, polysilicon has commonly been used as the gate electrode of a MOSFET. A copending patent application with title "Method for Fabricating a Polysilicon Structure with Reduced Length that is Beyond Photolithography Limitations," filed concurrently herewith and having Ser. No. 09/306,874 (now U.S. Pat. No. 6,060,377), and having same inventors and assignee herewith describes a method for fabricating a polysilicon MOSFET gate with reduced length. This copending patent application with Ser. No. 09/306,874 is incorporated herewith in its entirety by reference.

However, as MOSFET dimensions are scaled down for improved performance, a polysilicon gate may introduce depletion capacitance at the gate of the MOSFET resulting in a lowered effective gate capacitance. A lowered effective gate capacitance may require higher bias voltage for charge accumulation under the gate of the MOSFET. Such a higher bias voltage is disadvantageous because of the higher power dissipation. Thus, as MOSFET dimensions are scaled down for improved performance, a metal structure, instead of a polysilicon structure, is more desirable for the gate electrode of the MOSFET.

Consequently, a method for fabricating a metal structure for the gate electrode of a MOSFET with controllable reduced gate lengths that are beyond those achievable from photolithography technology is desired.

SUMMARY OF THE INVENTION

Accordingly, the present invention is a method for fabricating a metal structure with a reduced length that is beyond that achievable from photolithography by using a silicidation anneal to control the reduced length. Generally, the present invention includes a step of forming a base metal structure on a semiconductor substrate. The base metal structure has a first predetermined length defined by sidewalls on ends of the first predetermined length of the base metal structure. The present invention also includes the step of depositing a layer of silicon on the sidewalls of the base metal structure, and this layer of silicon has a predetermined thickness.

The layer of silicon reacts with the base metal structure at the sidewalls of the base metal structure in a silicidation anneal to form metal silicide comprised of the layer of silicon that has reacted with the base metal structure at the sidewalls of the base metal structure. The base metal structure has a second predetermined length that is reduced from the first predetermined length when the layer of silicon has consumed into the sidewalls of the base metal structure after the silicidation anneal. The second predetermined length depends on the predetermined thickness of the layer of silicon deposited on the sidewalls of the base metal structure. The metal silicide is then removed from the sidewalls of the base metal structure. A remaining portion of the base metal structure, after the metal silicide is removed, forms the metal structure of the present invention having the reduced length that is substantially equal to the second predetermined length.

The present invention may be used to particular advantage when the metal structure having the reduced length forms a gate electrode of a MOSFET (Metal Oxide Semiconductor Field Effect Transistor).

These and other features and advantages of the present invention will be better understood by considering the following detailed description of the invention which is presented with the attached drawings.

The figures referred to herein are drawn for clarity of illustration and are not necessarily drawn to scale. Moreover, the figures referred to herein focus on a few regions within a larger integrated circuit. Elements having the same reference number in FIGS. 1, 2, 3, 4, and 5 refer to elements having similar structure and function.

DETAILED DESCRIPTION

The present invention is described for achieving a reduced length of a metal structure used as a gate electrode of a MOSFET (Metal Oxide Semiconductor Field Effect Transistor). However, the present invention may be used for fabrication of a metal structure having a reduced length that is beyond photolithography limitations for any other type of application aside from just the example of a gate electrode of a MOSFET, as would be apparent to one of ordinary skill in the art from the description herein.

Figure 1A:
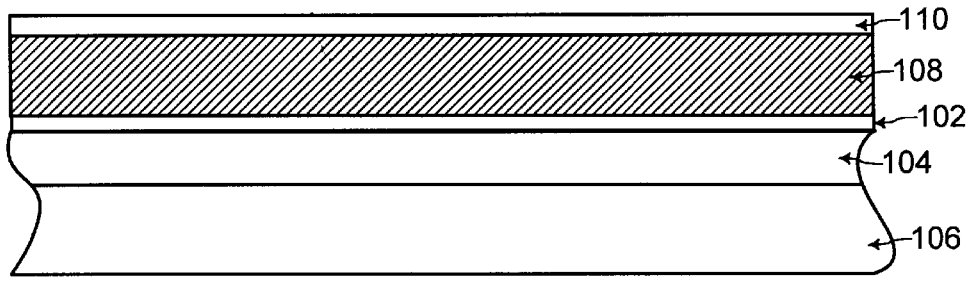
FIGS. 1A and 1B illustrate, with cross sectional views, the steps for forming a base metal structure having a first predetermined length, according to an embodiment of the present invention.

Referring to FIG. 1A, for fabrication of a metal structure that is used as a gate electrode of a MOSFET, a layer of gate dielectric 102 is formed on a lightly doped layer of semiconductor substrate 104. The lightly doped layer of semiconductor substrate 104 forms the body of the MOSFET and is disposed within a semiconductor wafer 106. For high performance MOSFETs with scaled down dimensions, the thickness of the layer of gate dielectric 102 has been scaled down, and the layer of gate dielectric 102 is comprised of dielectric material having a dielectric constant that provides for a higher breakdown voltage than silicon dioxide.

A layer of metal 108 is deposited on the layer of gate dielectric 102. The metal structure of the present invention, having the reduced length beyond that achievable with photolithography technology, is formed from the layer of metal 108. A silicon oxynitride (SiON) layer 110 is formed on the layer of metal 108. Technologies for forming the layer of gate dielectric 102, the layer of metal 108, and the silicon oxynitride layer 110 are known to one of ordinary skill in the art of integrated circuit fabrication.

Figure 1B:
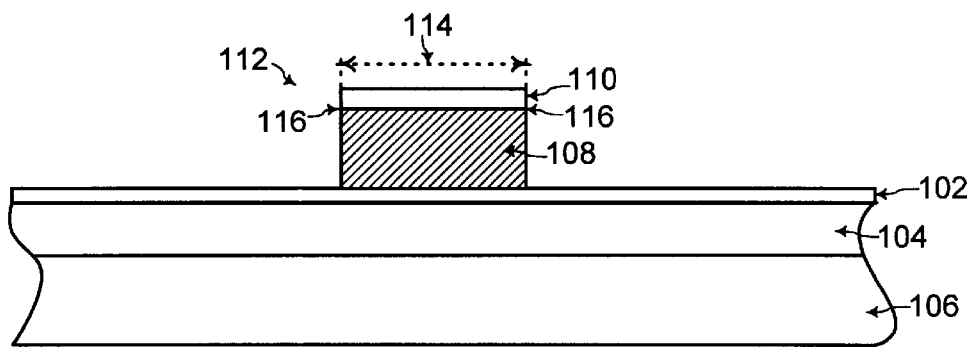

Referring to FIG. 1B, a base metal structure 112 of the present invention is formed by patterning the silicon oxynitride layer 110 and the layer of metal 108 with an etching process such as RIE (Reactive Ion Etching) that is known to one of ordinary skill in the art of integrated circuit fabrication. The silicon oxynitride layer 110 acts as a BARC (Bottom Anti-Reflective Coating) during the etching process for improved resolution during the patterning of the silicon oxynitride layer 110 and the layer of metal 108 to form the base metal structure 112. The base metal structure 112 comprises the silicon oxynitride layer 110 having a first predetermined length 114 and the layer of metal 108 having the first predetermined length 114. Referring to FIG. 1B, the first predetermined length 114 is defined by sidewalls 116 at the ends of the first predetermined length 114 of the base metal structure 112.

Referring to FIG. 1B, in the etching process for patterning the silicon oxynitride layer 110 and the layer of metal 108 to form the base metal structure 112, the layer of gate dielectric 102 may be an etch stop. Etching of portions of the silicon oxynitride layer 110 and the layer of metal 108 stops when portions of the layer of gate dielectric 102 are exposed. Thus, the layer of gate dielectric 102 is exposed where the base metal structure 112 does not cover the layer of gate dielectric 102.

Figure 2A:
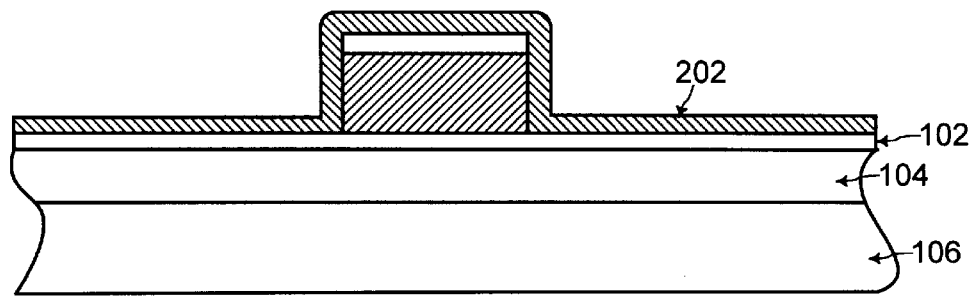
FIGS. 2A and 2B illustrate, with cross sectional views, the steps for depositing a layer of silicon on the sidewalls of the base metal structure of FIGS. 1A and 1B, according to an embodiment of the present invention.

Referring to FIGS. 1B and 2A, a layer of silicon 202 is conformally deposited on the top and the sidewalls 116 of the base metal structure 112 and on any exposed areas of the layer of gate dielectric 102. For conformal deposition of the layer of silicon 202, a deposition process such as CVD (Chemical Vapor Deposition), as known to one of ordinary skill in the art of integrated circuit fabrication, may be used. The layer of silicon 202 has a predetermined thickness that is controllable during the deposition process.

Figure 2B:
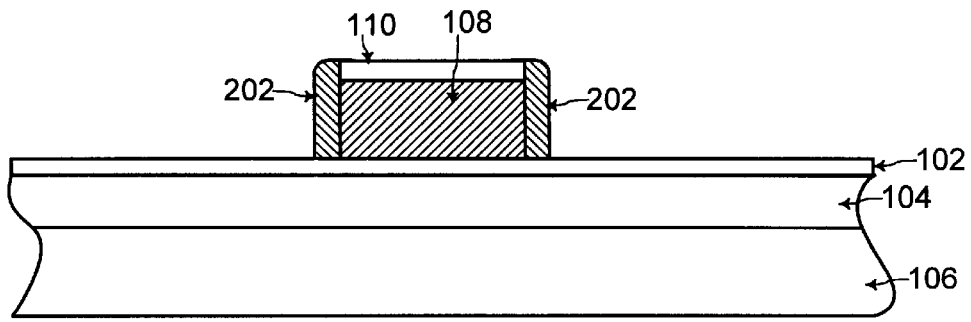

Referring to FIG. 2B, the layer of silicon 202 is anisotropically etched with an etching process such as RIE (Reactive Ion Etching), as known to one of ordinary skill in the art of integrated circuit fabrication, from the top of the base metal structure 112 and the exposed areas of the layer of gate dielectric 102. In this etching process, the silicon oxynitride layer 110 and/or the layer of gate dielectric 102 may be used as an etch stop. After such an etching process, the layer of silicon 202 remains on the sidewalls 116 of the base metal structure 112.

Figure 3:
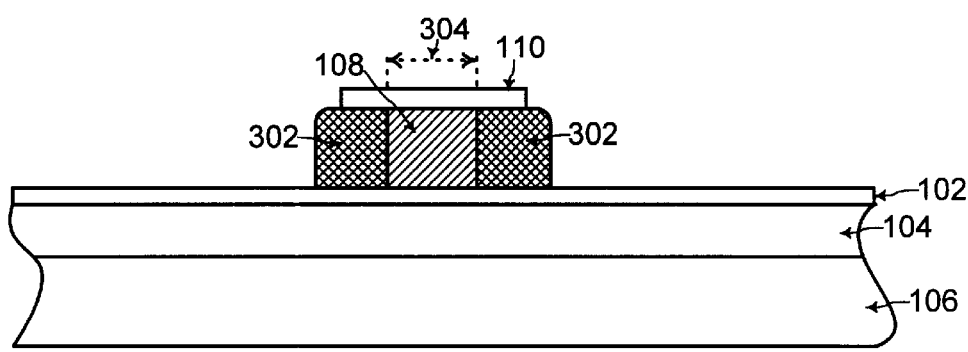
FIG. 3 illustrates with a cross sectional view, the step for reducing the first predetermined length of the base metal structure of FIGS. 1 and 2 to a second predetermined length, using a silicidation anneal, according to an embodiment of the present invention.

Referring to FIGS. 2B and 3, a silicidation anneal is performed such that the layer of silicon 202 reacts with the layer of metal 108 at the sidewalls 116 of the layer of metal 108 to form metal silicide 302. Referring to FIG. 3, the metal silicide 302 has consumed into the sidewalls 116 of the layer of metal 108 such that the layer of metal 108 has a second predetermined length 304 after the silicidation anneal. Thus, referring to FIGS. 1B and 3, the second predetermined length 304 of the layer of metal 108, after the silicidation anneal, is reduced from the first predetermined length 114 of the layer of metal 108 before the silicidation anneal. The amount of this reduction in length and thus the second predetermined length 304 of the layer of metal 108 depends on the amount of silicon and thus on the predetermined thickness of the layer of silicon 202 deposited on the sidewalls 116 of the base metal structure 112 as illustrated in FIG. 2B.

Figure 4A:
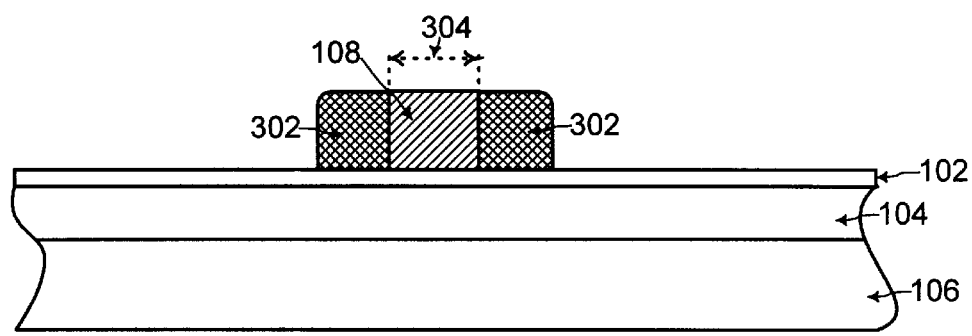
FIGS. 4A and 4B illustrate, with cross sectional views, the steps for forming the metal structure of the present invention, after the silicidation anneal of the base metal structure, having the reduced length that is beyond that achievable with photolithography.
Figure 4B:
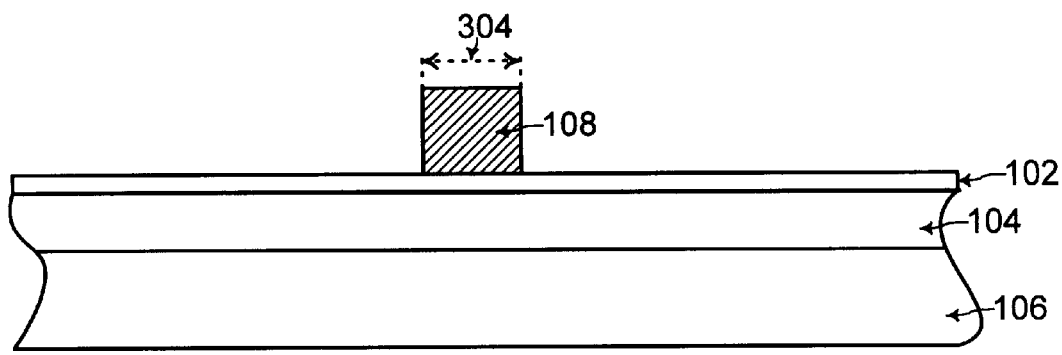

Referring to FIG. 4A, the silicon oxynitride layer 110 is removed by a wet or dry etching process as known to one of ordinary skill in the art of integrated circuit fabrication. Referring to FIG. 4B, the metal silicide 302 at the sidewalls 116 of the layer of metal 108 is removed with a selective wet etch. Such an etching process is known to one of ordinary skill in the art of integrated circuit fabrication. A remaining layer of metal 108 has the second predetermined length 304.

In this manner, referring to FIG. 4B, the metal structure of the present invention is the remaining layer of metal 108 that has the reduced length that is substantially equal to the second predetermined length 304. Referring to FIGS. 1B and 3, the second predetermined length 304 of the remaining layer of metal 108 formed after the silicidation anneal is reduced from the first predetermined length 114 before the silicidation anneal. Referring to FIG. 1B, the first predetermined length 114 is determined from the photolithography technology used during patterning of the base metal structure 112. The first predetermined length 114 may be limited by photolithography technology.

Referring to FIG. 3, the silicidation anneal further reduces the length of the remaining layer of metal 108 from the first predetermined length 114 to the second predetermined length 304. Thus, the second predetermined length 304 is smaller than that achievable with photolithography technology. Furthermore, referring to FIG. 2B, the amount of reduction from the first predetermined length 114 to the second predetermined length 304 is determined by the thickness of the layer of silicon 202 deposited on the sidewalls 116 of the base metal structure 112. Thus, the reduced length of the metal structure of the present invention may be better controlled than the prior art photoresist trimming technology.

Figure 5:
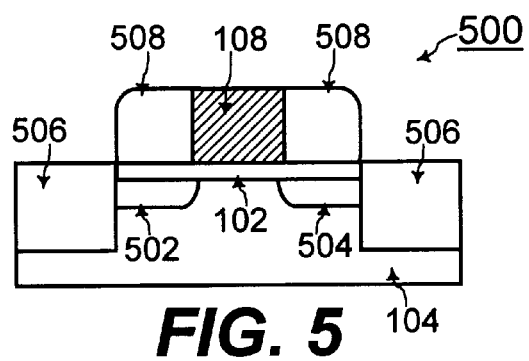
FIG. 5 shows use of the metal structure having the reduced length as a gate electrode of a MOSFET (Metal Oxide Semiconductor Field Effect Transistor).

Referring to FIG. 5, the metal structure of the present invention having the reduced length may advantageously be used as a gate electrode of a MOSFET 500 (Metal Oxide Semiconductor Field Effect Transistor). In that case, the layer of gate dielectric 102 is patterned to form the gate dielectric of the MOSFET 500. In addition, a drain 502 and a source 504 of the MOSFET is formed within the semiconductor substrate 104. Shallow trench isolation structures 506 and dielectric spacers 508 are also formed as part of the MOSFET 500. Fabrication technology for forming such parts of the MOSFET 500 are known to one of ordinary skill in the art of integrated circuit fabrication.

The foregoing is by way of example only and is not intended to be limiting. For example, the layer of silicon 202 may be comprised of polysilicon or amorphous silicon. In addition, the present invention has been described for achieving a reduced length of a metal structure used as a gate electrode of a MOSFET (Metal Oxide Semiconductor Field Effect Transistor). However, the present invention may be used for fabrication of a metal structure having a reduced length that is beyond photolithography limitations for any other type of application aside from just the example of a gate electrode of a MOSFET, as would be apparent to one of ordinary skill in the art from the description herein.

Furthermore, as will be understood by those skilled in the art, the integrated circuit structures described herein may be made or used in the same way regardless of their position and orientation. Accordingly, it is to be understood that terms and phrases such as "sidewalls," "on," and "on top of" as used herein refer to the relative location and orientation of various portions of the structures with respect to one another, and are not intended to suggest that any particular absolute orientation with respect to external objects is necessary or required.

The invention is limited only as defined in the following claims and equivalents thereof.

We claim:

1. A method for fabricating a metal structure with a reduced length, the method including the steps of:
    A. forming a base metal structure on a semiconductor substrate, said base metal structure having a first predetermined length defined by sidewalls on ends of said first predetermined length of said base metal structure;
    B. depositing a layer of silicon on said sidewalls of said base metal structure, said layer of silicon having a predetermined thickness;
    C. reacting said layer of silicon with said base metal structure at said sidewalls of said base metal structure in a silicidation anneal to form metal silicide comprised of said layer of silicon that has reacted with said base metal structure at said sidewalls of said base metal structure;
    and wherein said base metal structure has a second predetermined length that is reduced from said first predetermined length when said layer of silicon has consumed into said sidewalls of said base metal structure after said silicidation anneal;
    and wherein said second predetermined length depends on said predetermined thickness of said layer of silicon deposited on said sidewalls of said base metal structure in said step B; and
    D. removing said metal silicide from said sidewalls of said base metal structure, wherein a remaining portion of said base metal structure, after said metal silicide is removed, forms said metal structure having said reduced length that is substantially equal to said second predetermined length.

2. The method of claim 1, wherein said step A further includes the steps of:
    forming a layer of dielectric material on said semiconductor substrate;
    depositing a layer of metal on said layer of dielectric material;
    forming a silicon oxynitride layer on said layer of metal; and
    patterning said silicon oxynitride layer and said layer of metal with an etching process to form said base metal structure comprising said silicon oxynitride layer having said first predetermined length and disposed on said layer of metal having said first predetermined length;
    and wherein said layer of dielectric material is an etch stop in said step of patterning said silicon oxynitride layer and said layer of metal such that said layer of dielectric material is exposed where said base metal structure does not cover said layer of dielectric material.

3. The method of claim 2, wherein said metal structure is a gate electrode of a MOSFET (Metal Oxide Semiconductor Field Effect Transistor), and wherein said method further includes the step of forming a gate dielectric of said MOSFET from said layer of dielectric material and of forming a drain and a source of said MOSFET.

4. The method of claim 2, where said step B further includes the steps of:
    depositing conformally said layer of silicon on top and on said sidewalls of said base metal structure and on any exposed areas of said layer of dielectric material; and
    anisotropically etching said layer of silicon from the top of said base metal structure and from said exposed areas of said layer of dielectric material such that said layer of silicon remains on said sidewalls of said base metal structure.

5. The method of claim 4, wherein said metal silicide has consumed into said sidewalls of said layer of metal after said silicidation anneal such that said layer of metal has said second predetermined length after said silicidation anneal.

6. The method of claim 5, further including the steps of:
    etching away said layer of silicon oxynitride on said base metal structure before said step D.

7. The method of claim 1, wherein said layer of silicon is a layer of polysilicon.

8. The method of claim 1, wherein said layer of silicon is a layer of amorphous silicon.

9. A method for fabricating a metal gate electrode of a MOSFET (Metal Oxide Semiconductor Field Effect Transistor), said metal gate electrode having a reduced length, the method including the steps of:

A. forming a base metal structure on a semiconductor substrate, said base metal structure having a first predetermined length defined by sidewalls on ends of said first predetermined length of said base metal structure, said step A further including the steps of:

forming a layer of dielectric material on said semiconductor substrate;

depositing a layer of metal on said layer of dielectric material;

forming a silicon oxynitride layer on said layer of metal; and patterning said silicon oxynitride layer and said layer of metal with an etching process to form said base metal structure comprising said silicon oxynitride layer having said first predetermined length and disposed on said layer of metal having said first predetermined length;

and wherein said layer of dielectric material is an etch stop in said step of patterning said silicon oxynitride layer and said layer of metal such that said layer of dielectric material is exposed where said base metal structure does not cover said layer of dielectric material;

B. depositing a layer of polysilicon on said sidewalls of said base metal structure, said layer of polysilicon having a predetermined thickness, wherein said step B further includes the steps of:

depositing conformally said layer of polysilicon on top and on said sidewalls of said base metal structure and on any exposed areas of said layer of dielectric material; and anisotropically etching said layer of polysilicon from the top of said base metal structure and from said exposed areas of said layer of dielectric material such that said layer of polysilicon remains on said sidewalls of said base metal structure;

C. reacting said layer of polysilicon with said base metal structure at said sidewalls of said base metal structure in a silicidation anneal to form metal silicide comprised of said layer of polysilicon that has reacted with said base metal structure at said sidewalls of said base metal structure;

and wherein said base metal structure has a second predetermined length that is reduced from said first predetermined length when said layer of polysilicon has consumed into said sidewalls of said base metal structure after said silicidation anneal;

and wherein said second predetermined length depends on said predetermined thickness of said layer of polysilicon deposited on said sidewalls of said base metal structure in said step B;

and wherein said metal silicide has consumed into said sidewalls of said layer of metal after said silicidation anneal such that said layer of metal has said second predetermined length after said silicidation anneal;

D. etching away said layer of silicon oxynitride on said base metal structure;

E. removing said metal silicide from said sidewalls of said base metal structure, wherein a remaining portion of said base metal structure, after said metal silicide is removed, forms said metal gate electrode of said MOSFET, said metal gate electrode having said reduced length that is substantially equal to said second predetermined length; and F. forming a gate dielectric of said MOSFET from said layer of dielectric material and forming a drain and a source of said MOSFET.

* * * * *